United States Patent
Park et al.

(10) Patent No.: US 12,051,606 B2
(45) Date of Patent: Jul. 30, 2024

(54) APPARATUS, METHOD AND RECORDING MEDIUM STORING COMMAND FOR INSPECTION

(71) Applicant: KOH YOUNG TECHNOLOGY INC., Seoul (KR)

(72) Inventors: Jung Woo Park, Hwaseong-si (KR); Byung Sun Oh, Siheung-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 0 days.

(21) Appl. No.: 18/316,413

(22) Filed: May 12, 2023

(65) Prior Publication Data
US 2023/0282499 A1  Sep. 7, 2023

Related U.S. Application Data

(63) Continuation of application No. 17/280,037, filed as application No. PCT/KR2019/013396 on Oct. 11, 2019, now Pat. No. 11,694,916.

(30) Foreign Application Priority Data

Oct. 15, 2018 (KR) ........................ 10-2018-0122323

(51) Int. Cl.
*H01L 21/67* (2006.01)
*G01B 11/25* (2006.01)

(52) U.S. Cl.
CPC .... *H01L 21/67242* (2013.01); *G01B 11/2545* (2013.01); *G01B 11/2513* (2013.01); *G01B 11/2518* (2013.01)

(58) Field of Classification Search
CPC ..... G01B 11/24; G01B 11/25; G01B 11/2518; G01B 11/26; G01B 9/02091;
(Continued)

(56) References Cited

U.S. PATENT DOCUMENTS 8,885,040 B2   11/2014  Puah et al.
9,967,516 B2 *  5/2018  Chang .................. H04N 13/254
(Continued)

FOREIGN PATENT DOCUMENTS

CN       103185549       7/2013
CN       103733019       4/2014
(Continued)

OTHER PUBLICATIONS

International Search Report, with English translation, for International Application No. PCT/KR2019/013396, dated Jan. 20, 2020.
(Continued)

*Primary Examiner* — Michael P Stafira
(74) *Attorney, Agent, or Firm* — KILE PARK REED & HOUTTEMAN PLLC

(57) ABSTRACT

The present disclosure provides an apparatus. The apparatus according to the present disclosure comprises: at least one first light source configured to irradiate illumination light to an object on a reference surface; at least one second light source configured to irradiate pattern light to the object, a plurality of cameras configured to capture one or more illumination images and one or more pattern images; and one or more processors configured to determine a plurality of outlines indicating edges of the object based on two or more images captured in different directions among the one or more illumination images and the one or more pattern images; determine a virtual plane corresponding to an upper surface of the object based on the plurality of outlines; and determine an angle between the virtual plane and the reference plane.

17 Claims, 9 Drawing Sheets

(58) Field of Classification Search
CPC ..... G01B 11/2441; G01B 11/00; G01B 11/06;
G01B 11/2513; G01B 11/2545; G01B
9/02032; G01B 11/0608; G01B 11/30;
G01B 11/002; G01B 11/14; G01B
2210/56; G01B 11/306; G01B 11/2527;
G01B 11/2522; G01B 9/0203; G01B
11/245; G01B 2290/15; G01B 11/0691;
G01B 11/2504; G01B 9/02; G01B 11/03;
G01B 9/02038; G01B 9/02047; G01B
11/0625; G01B 11/254; G01B 9/021;
G01B 11/026; G01B 9/02057; G01B
9/04; G01B 11/255; G01B 21/08; G01B
2290/60; G01B 9/02044; G01B 9/02049;
G01B 11/005; G01B 21/22; G01B
2210/52; G01B 9/02061; G01B 11/02;
G01B 11/0633; G01B 11/22; G01B
21/04; G01B 2210/50; G01B 9/02065;
G01B 11/2433; G01B 11/303; G01B
21/042; G01B 21/26; G01B 2210/28;
G01B 2290/25; G01B 5/255; G01B
9/02018; G01B 9/02072; G01B 9/02087;
G01B 11/046; G01B 11/08; G01B
11/2425; G01B 11/2509; G01B 11/2536;
G01B 11/272; G01B 21/045; G01B
2210/20; G01B 5/008; G01B 7/315;
G01B 9/02015; G01B 11/022; G01B
11/167; G01B 11/2416; G01B 2290/65;
G01B 5/0037; G01B 5/02; G01B
9/02054; G01B 9/02067; G01B 9/02075;
G01B 9/02076; G01B 9/02083; G01B
9/02084; H01L 22/12; H01L 27/14627;
H01L 27/14643; H01L 27/148; H01L
22/30; H01L 27/14625; H01L 21/67242;
H01L 27/146; H01L 21/027; H01L 22/24;
H01L 2924/0002; H01L 27/14607; H01L
27/14618; H01L 27/14621; H01L
27/14623; H01L 27/14629; H01L
27/14632; H01L 27/14685; H01L
27/14687; H01L 33/08; H01L 33/50;
H01L 33/505; H01L 33/58; H01L
2924/3511; H01L 21/67144; H01L
21/67259; H01L 21/681; H01L 21/822;
H01L 2224/78; H01L 24/78; H01L 27/04;
H01L 2924/14; H01L 21/02378; H01L
21/02433; H01L 21/02447; H01L
21/02499; H01L 21/02529; H01L
21/02576; H01L 21/02609; H01L
21/0262; H01L 21/046; H01L 21/0485;
H01L 21/049; H01L 21/67167; H01L
21/67288; H01L 21/67742; H01L
21/67748; H01L 21/68; H01L 21/78;
H01L 2224/05568; H01L 2224/05573;
H01L 2224/16; H01L 2224/16221; H01L
2224/16225; H01L 2224/1703; H01L
2224/48091; H01L 2224/48465; H01L
2224/85; H01L 2224/859; H01L 24/16;
H01L 24/17; H01L 25/0753; H01L
29/045; H01L 29/1608; H01L 29/34;
H01L 29/66068; H01L 29/7802; H01L
2924/00014; H01L 2924/01082; H01L
2924/12041; H01L 2924/15159; H01L
33/62; H01L 21/6838; H01L 2224/48;
H01L 2224/48247; H01L 2224/49171;
H01L 2224/73265; H01L 2224/78301;
H01L 2224/78823; H01L 2224/85181;
H01L 2224/85205; H01L 2224/92247;
H01L 27/1222; H01L 27/14678; H01L
2924/01004; H01L 2924/01005; H01L
2924/01006; H01L 2924/01033; H01L
2924/01039; H01L 2924/0105; H01L
2924/01078; H01L 2924/01079; H01L
2924/10161; H01L 33/60
See application file for complete search history.

(56) References Cited

U.S. PATENT DOCUMENTS

| | | | |
|---|---|---|---|
| 2001/0006419 | A1 | 7/2001 | Hallmeyer et al. |
| 2004/0027586 | A1 | 2/2004 | Ichikawa et al. |
| 2005/0056947 | A1 | 3/2005 | Blessing |
| 2005/0073590 | A1 | 4/2005 | Mamiya |
| 2009/0153881 | A1 | 6/2009 | Cho et al. |
| 2011/0002527 | A1 | 1/2011 | Jeong et al. |
| 2011/0050893 | A1 | 3/2011 | Lee et al. |
| 2011/0228052 | A1 | 9/2011 | Ohnishi et al. |
| 2012/0019836 | A1 | 1/2012 | Honma et al. |
| 2013/0215262 | A1 | 8/2013 | Jeong et al. |
| 2014/0320627 | A1 | 10/2014 | Miyamoto et al. |
| 2014/0354804 | A1 | 12/2014 | Lee et al. |
| 2014/0354805 | A1 | 12/2014 | Lee et al. |
| 2015/0144769 | A1 | 5/2015 | Nozawa et al. |
| 2015/0355101 | A1 | 12/2015 | Sun |
| 2016/0037121 | A1 | 2/2016 | Chang et al. |
| 2017/0038197 | A1 | 2/2017 | Lee et al. |
| 2017/0370707 | A1 | 12/2017 | Murakami et al. |
| 2018/0059019 | A1 | 3/2018 | Chouaib et al. |
| 2018/0156606 | A1 | 6/2018 | Jeon |
| 2018/0278911 | A1 | 9/2018 | Lee et al. |
| 2019/0049244 | A1 | 2/2019 | Gu et al. |
| 2019/0094151 | A1 | 3/2019 | Jeon et al. |
| 2019/0226837 | A1 | 7/2019 | Jeon |
| 2019/0293413 | A1 | 9/2019 | Lee et al. |

FOREIGN PATENT DOCUMENTS

| | | | | |
|---|---|---|---|---|
| CN | 107003255 | | 8/2017 | |
| CN | 107735645 | | 2/2018 | |
| DE | 102012207653 | A1 * | 11/2013 | ......... G01B 11/2545 |
| DE | 102015210440 | A1 * | 12/2015 | ............ G01B 11/24 |
| EP | 3 278 058 | | 2/2018 | |
| JP | 11-166818 | | 6/1999 | |
| JP | H11148810 | A * | 6/1999 | |
| JP | 2000-99760 | | 4/2000 | |
| JP | 2001-308594 | | 11/2001 | |
| JP | 2001-349710 | | 12/2001 | |
| JP | 2003-279334 | | 10/2003 | |
| JP | 2010091338 | | 4/2010 | |
| JP | 2010-243296 | | 10/2010 | |
| JP | 2011-112401 | | 6/2011 | |
| JP | 2012002780 | | 1/2012 | |
| JP | 2015-102442 | | 6/2015 | |
| JP | 2015232483 | A * | 12/2015 | ............ G01B 11/24 |
| JP | 2016-11857 | | 1/2016 | |
| JP | 2016-21514 | | 2/2016 | |
| KR | 10-2009-0062027 | | 6/2009 | |
| KR | 20090091157 | | 8/2009 | |
| KR | 10-2010-0108877 | | 10/2010 | |
| KR | 10-2011-0059631 | | 6/2011 | |
| KR | 20110116267 | A * | 10/2011 | |
| KR | 10-1081538 | | 11/2011 | |
| KR | 10-1628158 | | 6/2016 | |
| KR | 101639227 | B1 * | 7/2016 | |
| KR | 101659302 | | 9/2016 | |
| KR | 10-1705762 | | 2/2017 | |
| KR | 10-2017-0036222 | | 4/2017 | |
| KR | 10-2017-0124509 | | 11/2017 | |
| KR | 10-2017-0130896 | | 11/2017 | |
| WO | 2012066139 | | 5/2012 | |

(56) References Cited

FOREIGN PATENT DOCUMENTS

| WO | 2013105194 | 7/2013 |
|---|---|---|
| WO | 2016/160930 | 10/2016 |
| WO | 2020003384 | 1/2020 |

OTHER PUBLICATIONS

Written Opinion, with English translation, for International Application No. PCT/KR2019/013396, dated Jan. 20, 2020.
Ming Chang et al. "Nondestructive measurement of bond line thickness and die tilt in the die attach for semiconductor packaging", Nondestructive Testing and Evaluation, Jun. 2008, pp. 89-98, vol. 23, No. 2.
Neil Hubble, "Measuring Die Tilt Using Shadow Moire Optical Measurements; New Techniques for Discontinuous and Semi-Reflective Surfaces", International Symposium on Microelectronics, 2016, pp. 1-6.
Korean Office Action, with English translation, corresponding to Korean Application No. 10-2019-0126390, dated Dec. 23, 2020.
Po-Cheng Chen et al.; "Bond line thickness and die till inspection in die bonding process"; Journal of the Chinese Institute of Engineers; vol. 39, No. 4, pp. 508-512, published Jan. 20, 2016.
Korean Office Action with English translation for Korean Application or Publication No. 10-2021-0073420, dated Sep. 27, 2021.
European Office Action for European Application No./Patent No. 19873586.2, dated Oct. 27, 2021.
Extended European Search Report for European Application No. 23197893.3, dated Oct. 31, 2023.
Han et al., "Unmarked Microscopic Imaging based on Different Light Sources", Acta Laser Biology Sinica, Apr. 2018, pp. 103-118, vol. 27, No. 2.
Nomura et al., "Alignment stage used in microlithography", Special equipment for electronic industry, Feb. 1995, pp. 48-51, vol. 24.
Chinese Office Action with English translation for Chinese Patent Application No. 201980065992.7, dated Apr. 29, 2024.

\* cited by examiner

FIG. 5
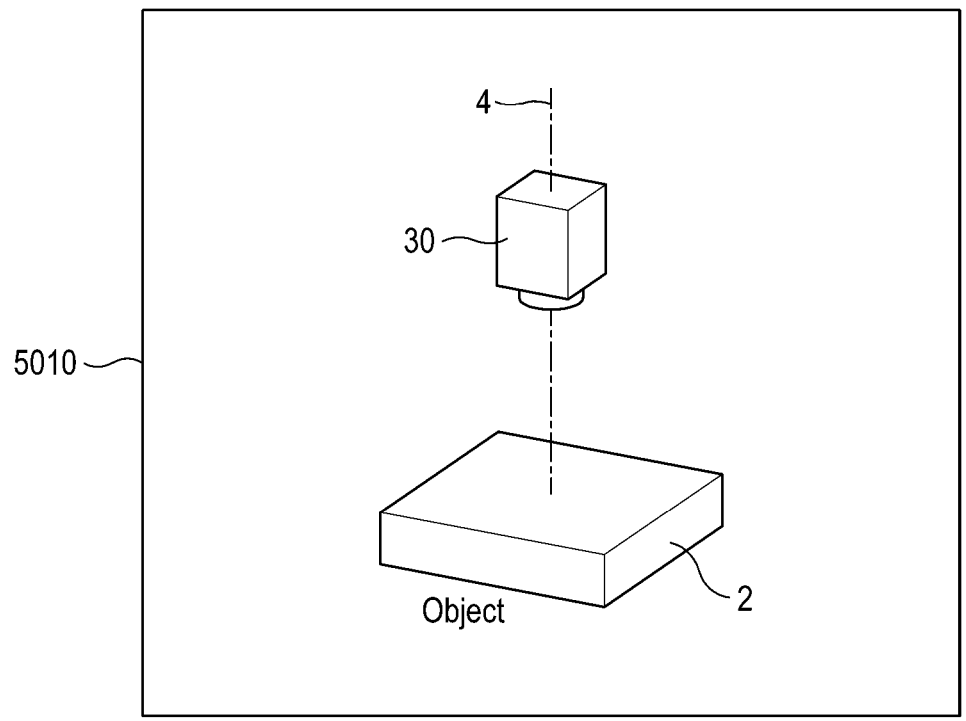
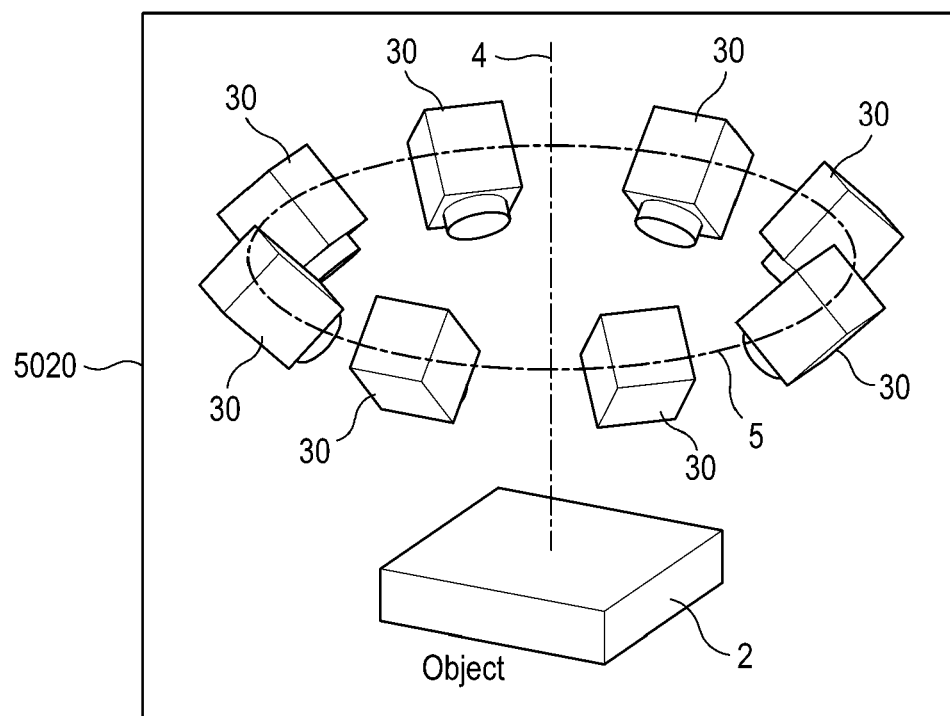

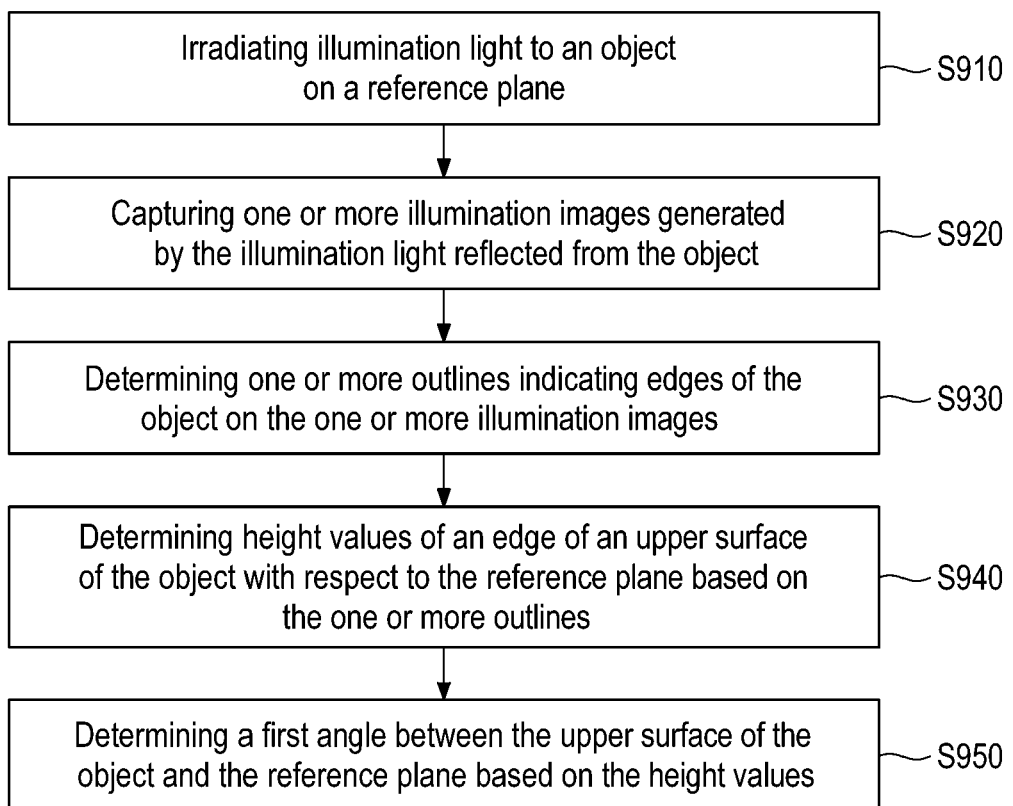

APPARATUS, METHOD AND RECORDING MEDIUM STORING COMMAND FOR INSPECTION

CROSS REFERENCE TO RELATED APPLICATIONS

This is a continuation application of U.S. patent application Ser. No. 17/280,037, filed Mar. 25, 2021 (currently pending), the disclosure of which is incorporated herein by reference in its entirety. U.S. patent application Ser. No. 17/280,037 is a national entry of International Application No. PCT/KR2019/013396, filed Oct. 11, 2019, the disclosure of which is incorporated herein by reference in its entirety. The International Application No. PCT/KR2019/013396 claims the priority to and benefits of Korean Patent Application No. 10-2018-0122323 filed Oct. 15, 2018, which are hereby incorporated by reference in its entirety into this application.

TECHNICAL FIELD

The present disclosure relates to a technology for inspection.

BACKGROUND

In a semiconductor manufacturing process, various inspections are conducted to check if various treatments, processes and the like for a semiconductor have been properly performed. For example, an inspection may be conducted as to whether a device such as a die or the like to be installed on a semiconductor substrate is positioned at a correct position on the semiconductor substrate.

In particular, for a die to be mounted on a semiconductor substrate, an inspection may be conducted to determine whether there is a tilt between the mounted die and the substrate. In general, a die may be mounted on solder or solder balls while the solder or solder balls are applied to the substrate. In this case, the die needs to be mounted so that the lower surface of the die is parallel to the reference plane of the semiconductor substrate. However, the die may be mounted in a state in which it is tilted at a certain angle or more with respect to the semiconductor substrate due to certain factors (e.g., the applied state of the solders or solder balls). Since this is a factor that may cause defects in a semiconductor device, whether the die is tilted and if tilted, at what angle or more the die is tilted should be able to be confirmed in the inspection process of the semiconductor.

In order to conduct such a tilt inspection, a three-dimensional inspection machine that irradiates three-dimensional illumination light on a semiconductor die may be used. However, this method has a problem in that it is difficult to acquire a three-dimensional shape for a die to be inspected. This is because, in general, the upper surface of the semiconductor die is made of a reflector, so that the irradiated three-dimensional illumination light may be totally reflected on the upper surface of the semiconductor die and, consequently, the image of the semiconductor die may not be captured well.

In addition, a device utilizing a White Light Scanning Interferometry may be used in order to conduct the above-described tilt inspection. However, this method has a problem in that, when a semiconductor die is tilted at a certain angle (e.g., 1.2 degrees) or more with respect to a reference plane, an image of the die is not formed.

In addition, a two-dimensional area inspection may be used in order to conduct the above-described tilt inspection. When taking an image of a tilted square semiconductor die, the semiconductor die looks like a parallelogram depending on the degree of tilt. The two-dimensional area inspection is a method that derives a degree of tilt through the shape of the parallelogram. However, this method also has a problem in that, when the upper surface of the semiconductor die is made of a reflector, an accurate parallelogram shape cannot be acquired, and the degree of tilt of the semiconductor die cannot be accurately predicted.

SUMMARY

The present disclosure provides a technique for inspection to solve the above-mentioned problems of the related arts.

As one aspect of the present disclosure, an apparatus for inspection can be proposed. The apparatus according to one aspect of the present disclosure may include: at least one first light source configured to irradiate illumination light to an object on a reference plane; one or more cameras configured to capture one or more illumination images generated by the illumination light reflected from the object; and one or more processors configured to: determine one or more outlines indicating edges of the object on the one or more illumination images; determine height values of an edge of an upper surface of the object with respect to the reference plane based on the one or more outlines; and determine a first angle between the upper surface of the object and the reference plane based on the height values.

In one embodiment, the apparatus may further include: at least one second light source configured to irradiate pattern light to the object, wherein the one or more cameras may be further configured to capture one or more pattern images generated by the pattern light reflected from the object, and the one or more processors are further configured to determine the one or more outlines indicating the edges of the object based on the one or more illumination images and the one or more pattern images, determine a virtual plane corresponding to the upper surface of the object based on the one or more outlines, and determine a second angle between the virtual plane and the reference plane as the first angle.

In one embodiment, the one or more cameras may include a top camera configured to capture an illumination image or a pattern image from above the object, and one or more side cameras configured to capture illumination images or pattern images from one or more sides of the object.

In one embodiment, at least one among the one or more illumination images and the one or more pattern images may be a top image captured from above the object by the top camera, and the other images among the one or more illumination images and the one or more pattern images may be side images captured from one or more sides of the object by the one or more side cameras.

In one embodiment, the one or more processors may be further configured to extract a first outline from the top image and a second outline from the one or more side images, the first and second outlines indicating the same one edge of the object, and determine the virtual plane based on the first outline and the second outline.

In one embodiment, the one or more processors may be further configured to determine first relationship information indicating a correspondence relationship between the first outline and the second outline, and determine the virtual plane based on the first relationship information.

In one embodiment, a first point on the first outline may correspond to a second point on the second outline, and the first relationship information may include a pair of coordinate information of the first point on the top image and coordinate information of the second point on the one or more side images.

In one embodiment, the one or more processors may be further configured to extract a third outline from one side image and a fourth outline from another side image among the one or more side images, the third and fourth outlines indicating the same one edge of the object, determine second relationship information indicating a correspondence relationship between the third outline and the fourth outline, and determine the virtual plane based on the first relationship information and the second relationship information.

In one embodiment, the one or more processors may be further configured to determine the virtual plane by selecting images in which contrast values of a surface of the object are equal to or greater than a predetermined value, among the one or more illumination images and the one or more pattern images.

In one embodiment, the object may have a form in which a plurality of layers are stacked, and the one or more outlines may indicate edges of the plurality of layers. The one or more processors may be further configured to determine a plurality of virtual planes corresponding to the plurality of layers based on the one or more outlines, and determine a spacing between the plurality of layers based on the plurality of virtual planes corresponding to the plurality of layers.

As another aspect of the present disclosure, a method for inspection may be proposed. The method according to another aspect of the present disclosure may include: irradiating, by at least one first light source, illumination light to an object on a reference plane; capturing, by one or more cameras, one or more illumination images generated by the illumination light reflected from the object; determining, by one or more processors, one or more outlines indicating edges of the object on the one or more illumination images; determining, by the one or more processors, height values of an edge of an upper surface of the object with respect to the reference plane based on the one or more outlines; and determining, by the one or more processors, a first angle between the upper surface of the object and the reference plane based on the height values.

In one embodiment, the method may further include: irradiating, by at least one second light source, pattern light to the object; capturing, by the one or more cameras, one or more pattern images generated by the pattern light reflected from the object; determining, by the one or more processors, the one or more outlines indicating the edges of the object based on the one or more illumination images and the one or more pattern images; determining, by the one or more processors, a virtual plane corresponding to the upper surface of the object based on the one or more outlines; and determining, by the one or more processors, a second angle between the virtual plane and the reference plane as the first angle.

In one embodiment, the one or more cameras may include a top camera configured to capture an illumination image or a pattern image from above the object, and one or more side cameras configured to capture illumination images or pattern images from one or more sides of the object.

In one embodiment, at least one among the one or more illumination images and the one or more pattern images may be a top image captured from above the object by the top camera, and the other images among the one or more illumination images and the one or more pattern images may be side images captured from one or more sides of the object by the one or more side cameras.

In one embodiment, the determining the virtual plane may include extracting a first outline from the top image and a second outline from the one or more side images, the first and second outlines indicating the same one edge of the object, and determining the virtual plane based on the first outline and the second outline.

In one embodiment, the determining the virtual plane may include determining first relationship information indicating a correspondence relationship between the first outline and the second outline, and determining the virtual plane based on the first relationship information.

In one embodiment, a first point on the first outline may correspond to a second point on the second outline, and the first relationship information may include a pair of coordinate information of the first point on the top image and coordinate information of the second point on the one or more side images.

In one embodiment, the determining the virtual plane may include extracting a third outline from one side image and a fourth outline from another side image among the one or more side images, the third and fourth outlines indicating the same one edge of the object, determining second relationship information indicating a correspondence relationship between the third outline and the fourth outline, and determining the virtual plane based on the first relationship information and the second relationship information.

In one embodiment, the determining the virtual plane may include determining the virtual plane by selecting images in which contrast values of a surface of the object are equal to or greater than a predetermined value, among the one or more illumination images and the one or more pattern images.

As another aspect of the present disclosure, a non-transitory computer-readable recording medium, that stores a program to be executed on a computer, may be proposed. The program includes commands that, when executed by one or more processors, cause the one or more processors to perform: determining one or more outlines indicating edges of an object on one or more illumination images generated by illumination light irradiated to the object on a reference plane and reflected from the object; determining height values of an edge of an upper surface of the object with respect to the reference plane based on the one or more outlines; and determining a first angle between the upper surface of the object and the reference plane based on the height values.

According to various embodiments of the present disclosure, even when the upper surface of an object is made of a reflector, it is possible to measure the tilt angle of the object.

According to various embodiments of the present disclosure, even when an object is tilted at a specific angle (e.g., 1.2 degrees) or more with respect to a reference plane of a substrate, it is possible to derive a degree of tilt.

According to various embodiments of the present disclosure, even when it is difficult to acquire a clear image of an object due to other obstructions of a substrate, it is possible to measure a tilt angle of an object.

According to various embodiments of the present disclosure, an accurate virtual three-dimensional model for an object may be generated by acquiring an image using light irradiated from various types of light sources at various angles and in various directions.

BRIEF DESCRIPTION OF DRAWINGS

FIG. 5 is a diagram illustrating a form in which one or more pattern light sources according to an embodiment of the present disclosure are arranged.

FIG. 9 is a diagram showing an example of a method for inspection, which may be performed by the apparatus according to an embodiment of the present disclosure.

DETAILED DESCRIPTION

Figure 1:
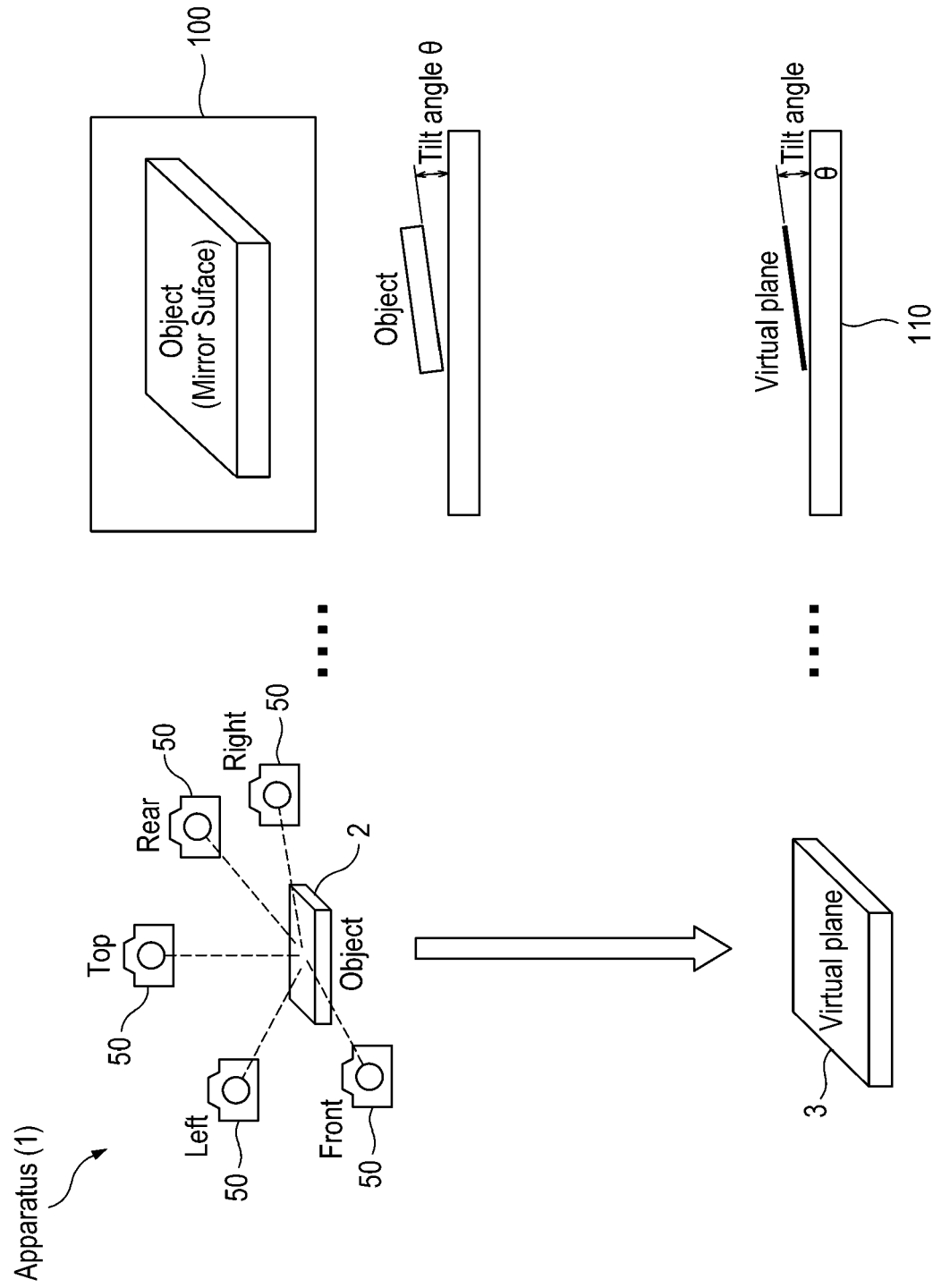
FIG. 1 is a diagram illustrating a process of operation of an apparatus according to an embodiment of the present disclosure.

The various embodiments described herein are exemplified for the purpose of clearly describing the technical idea of the present disclosure, and are not intended to limit the technical idea of the present disclosure to specific embodiments. The technical idea of the present disclosure includes various modifications, equivalents, alternatives of each of the embodiments described in this document, and embodiments selectively combined from all or part of the respective embodiments. In addition, the scope of the technical idea of the present disclosure is not limited to various embodiments or detailed descriptions thereof presented below.

The terms used herein, including technical or scientific terms, may have meanings that are generally understood by a person having ordinary knowledge in the art to which the present disclosure pertains, unless otherwise specified.

As used herein, the expressions such as "include", "may include", "provided with", "may be provided with", "have", and "may have" mean the presence of subject features (e.g., functions, operations, components, etc.) and do not exclude the presence of other additional features. That is, such expressions should be understood as open-ended terms that imply the possibility of including other embodiments.

A singular expression can include a meaning of plurality, unless otherwise mentioned, and the same is applied to a singular expression stated in the claims.

The terms "first", "second", etc. used herein are used to identify a plurality of components from one another, and are not intended to limit the order or importance of the relevant components.

As used herein, the expressions such as "A, B and C", "A, B or C", "A, B and/or C", "at least one of A, B and C", "at least one of A, B or C", "at least one of A, B and/or C", "at least one selected from A, B and C", "at least one selected from A, B or C", and "at least one selected from A, B and/or C" may mean each of the listed items or all available combinations of the listed items. For example, the expression "at least one selected from A and B" may refer to (1) at least one A, (2) at least one B, and (3) both at least one A and at least one B.

The expression "based on" used herein is used to describe one or more factors that influences a decision, an action of judgment or an operation described in a phrase or sentence including the relevant expression, and this expression does not exclude additional factor influencing the decision, the action of judgment or the operation.

As used herein, the expression that a certain component (e.g., a first component) is "connected" to another component (e.g., a second component) may mean that the certain component is connected to another component either directly or via a new different component (e.g., a third component).

As used herein, the expression "configured to" may have a meaning such "set to", "having the ability to", "modified to", "made to", "capable of", or the like depending on the context.

In the present disclosure, an object may refer to an object positioned on a predetermined surface and inspected by an apparatus. In one embodiment, the object may be a die, a semiconductor device or a chip positioned on a semiconductor substrate. The object may be mounted on a semiconductor substrate. As mentioned above, the object may be mounted such that the lower surface of the object is tilted at a predetermined angle with respect to a reference plane of a substrate.

In the present disclosure, the substrate may be a surface on which an object is positioned. In one embodiment, the substrate may be a semiconductor substrate. The reference plane of the substrate may refer to a surface of a substrate, and may be a surface used as a reference for measuring a tilt angle with a lower surface of an object.

Hereinafter, various embodiments of the present disclosure will be described with reference to the accompanying drawings. In the accompanying drawings and descriptions of the drawings, the same reference numerals may be assigned to the same or substantially equivalent elements. Furthermore, in the following description of various embodiments, the redundant descriptions of the same or corresponding elements may be omitted. However, this does not mean that the elements are not included in the embodiments.

FIG. 1 is a diagram illustrating a process of operation of an apparatus according to an embodiment of the present disclosure. The apparatus 1 according to an embodiment of the present disclosure may measure an angle θ at which an object 2 is tilted with respect to a reference plane (e.g., a substrate, etc.). The object 2 (e.g., a die, etc.) may be arranged on the reference plane. In some cases, the object 2 may be disposed in a state 100 in which it is tilted at a predetermined angle θ with respect to the reference plane. The apparatus 1 according to an embodiment of the present disclosure may inspect whether or not installation of the object 2 is defective, by measuring (determining) the tilt angle.

Specifically, illumination light sources of the apparatus 1 may irradiate two-dimensional illumination light onto the object 2 located on the reference plane. The illumination light may be reflected from surfaces of the object 2, i.e., the top surface or one or more side surfaces. One or more cameras 50 of the apparatus 1 may capture one or more illumination images generated by the reflection of the illumination light from the object 2.

The apparatus 1 may determine a plurality of outlines indicating edges of the object 2 on the acquired one or more illumination images. Each of the illuminated images may be a two-dimensional photograph representing the object 2 and/or the edges of the object 2. In the present disclosure, the edges of the object may mean the respective sides of the shape of the object existing in an actual three-dimensional space (e.g., the respective sides of a cube). Meanwhile, in the present disclosure, the outlines may mean the edges of the object appearing on the image of the object (i.e., the lines appearing on the image). In the present disclosure, the outlines may be referred to as boundary lines.

The apparatus 1 may determine a height value of each point of the edge of the upper surface of the object 2 with respect to the reference plane, based on the plurality of determined outlines. Furthermore, the apparatus 1 may determine a tilt angle θ between the upper surface of the object 2 and the reference plane based on the corresponding height values. The height value of the edge of the upper surface of the object may indicate a distance at which the each point of the corresponding edge is spaced apart from the reference plane. Accordingly, when the height values of the edge of the upper surface of the object are determined, it is possible to know the angle of the corresponding edge with respect to the reference plane. Accordingly, it is possible to determine at what angle the upper surface of the object is tilted with respect to the reference plane.

In one embodiment, the apparatus 1 may determine the tilt angle of the object by additionally using pattern light in addition to the illumination light. Specifically, the pattern light source of the apparatus 1 may irradiate pattern light toward the object 2. The pattern light may be reflected from the surfaces of the object 2, i.e., the upper surface or one or more side surfaces of the object 2. The one or more cameras 50 of the apparatus 1 may capture one or more pattern images generated by the pattern light reflected from the object 2.

In this case, the apparatus 1 may determine a plurality of outlines indicating the edges of the object 2 based on one or more illumination images and/or one or more pattern images. The apparatus 1 may determine a virtual plane 3 corresponding to the upper surface of the object 2 based on the plurality of determined outlines 110. The virtual plane 3 may be a plane on which the upper surface of the object 2 in an actual three-dimensional space is virtually implemented using computer graphics. The apparatus 1 may determine an angle between the virtual plane 3 and the reference plane as an angle θ between the object 2 and the reference plane 110.

In one embodiment, the object 2 may be a stacked memory in which a plurality of layers are stacked. In this case, a plurality of extracted outlines may indicate edges of the plurality of layers of the object 2. The apparatus 1 may determine a plurality of virtual planes based on a plurality of outlines acquired from an image of the object 2 having a stacked structure. The process of determining the virtual planes is as described above. Each of the determined virtual planes may correspond to each of the plurality of layers of the object 2 having the stacked structure. That is, one virtual plane may represent one of a plurality of layers. The apparatus 1 may determine a gap between the layers of the object 2 having the stacked structure, based on each of the determined virtual planes. In one embodiment, this process may be performed by the processor of the apparatus 1.

According to various embodiments of the present disclosure, even when it is difficult to acquire an inspection image for the upper surface of the object 2 to be inspected because the upper surface of the object 2 is made of a reflector, the apparatus 1 can measure a tilt angle of the object 2 by using the virtual plane of the object 2. In addition, according to various embodiments of the present disclosure, even when the object is tilted at a specific angle (e.g., 1.2 degrees) or more with respect to the reference plane, the apparatus 1 can generate a virtual plane to determine the degree of tilt of the object 2. Furthermore, according to various embodiments of the present disclosure, even when it is difficult to extract a clear image or outlines of the object 2 to be inspected due to various semiconductor devices and structures located on a substrate, it is possible to acquire necessary related information to perform inspection for the object 2. Moreover, according to various embodiments of the present disclosure, it is possible to accurately measure the object by acquiring an image through the use of the light irradiated from various types of light sources at various angles and in various directions.

Figure 2:
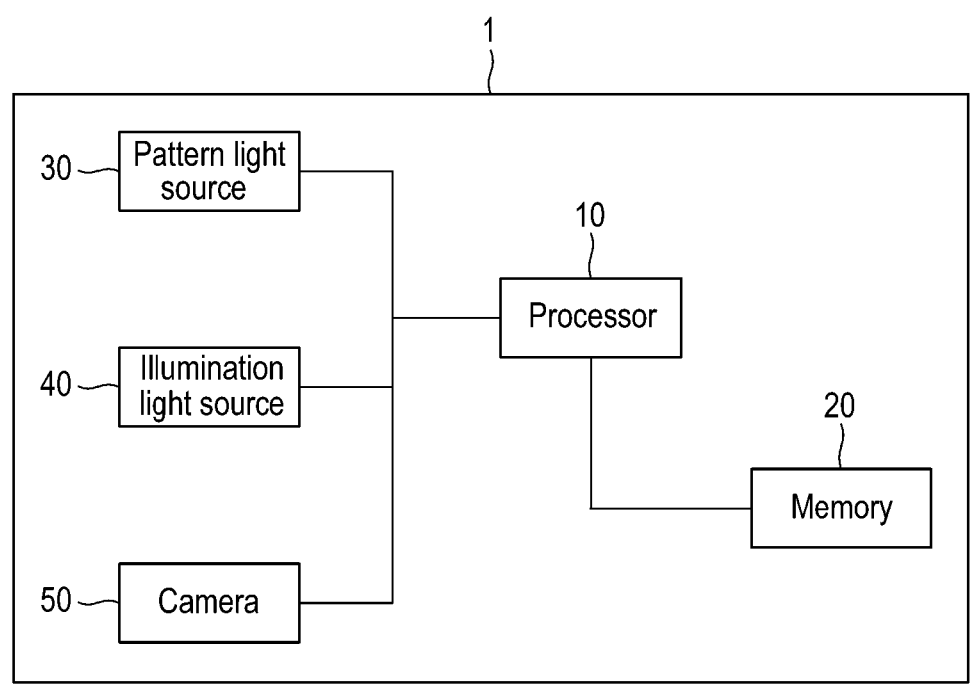
FIG. 2 is a block diagram of the apparatus according to an embodiment of the present disclosure.

FIG. 2 is a block diagram of the apparatus according to an embodiment of the present disclosure. In one embodiment, the apparatus 1 may include one or more processors 10, one or more memories 20, one or more pattern light sources 30, one or more illumination light sources 40 and/or one or more cameras 50. In one embodiment, at least one of these components of the apparatus 1 may be omitted, or another component may be added to the apparatus 1. In one embodiment, additionally or alternatively, some components may be integrated, or may be implemented as a singular entity or plural entities. In the present disclosure, one or more components (e.g., one or more processors 10) may be expressed as a component (e.g., processor 10), which may mean a set of one or more components, unless clearly expressed otherwise in context. In one embodiment, at least some of the internal and external components of the apparatus 1 may be connected to each other via a bus, a general purpose input/output (GPIO), a serial peripheral interface (SPI), a mobile industry processor interface (MIPI) and the like to exchange data and/or signals.

The illumination light sources 40 may irradiate two-dimensional illumination light onto the object 2. In one embodiment, the illumination light may be RGB light, and each of the illumination light sources 40 may include a red light source that irradiates red light, a green light source that irradiates green light, and a blue light source that irradiates blue light. In one embodiment, when irradiating the illumination light, the respective illumination light sources 40 may saturate the surface of the object by irradiating all of the red light, the green light and the blue light.

The pattern light sources 30 may irradiate pattern light onto the object 2. In one embodiment, the pattern light may be any structured light, grid pattern light (light whose luminous intensity changes in a sine wave pattern), line light, and the like. In one embodiment, the pattern light sources 30 may irradiate pattern light that is phase-shifted by a grating transfer mechanism such as a piezo actuator (PZT), or may irradiate pattern light generated by a digital light processing (DLP) method or a liquid crystal on silicon (LCoS) method. In one embodiment, each of the one or more pattern light sources 30 may irradiate the pattern light according to a method selected from the method using PZT, the DLP method and the LCoS method. In one embodiment, one or more (e.g., eight) pattern light sources 30 that irradiate pattern light in different directions from above the object 2 may be used.

The cameras 50 may capture illumination images and/or pattern images as described above. In one embodiment, the cameras 50 may be implemented as charge coupled devices (CCDs) or complementary metal oxide semiconductor (CMOS) cameras. In one embodiment, the one or more cameras 50 may include a top camera and/or one or more side cameras. The top camera may capture an illumination image or a pattern image reflected from the object 2 on the upper side of the object 2. Each of the one or more side cameras may capture an illumination image or a pattern image reflected from the object 2 on the lateral side or the upper lateral side of the object 2. In one embodiment, the one or more side cameras may include four cameras corresponding to the front, rear, left and right sides of the object 2. In one embodiment, an illumination image or a pattern image captured by the top camera on the upper side of the object 2 may be referred to as a top image. In addition, illumination images or pattern images captured by one or more side cameras on one or more lateral sides of the object 2 may be referred to as side images. That is, some among the above-described one or more illumination images and one or more pattern images may be top images, and other images among those may be side images.

The processor 10 may control at least one component of the apparatus 1 connected to the processor 10 by driving software (e.g., instructions, programs, etc.). In addition, the processor 10 may perform various operations related to the present disclosure, such as calculation, treatment, data generation, processing and the like. Further, the processor 10 may load data or the like from the memory 20 or may store data in the memory 20. In one embodiment, the processor 10 may determine a plurality of outlines of the object 2 on the one or more illumination images, may determine height values of an edge of the upper surface of the object 2 based on the plurality of outlines, and may determine an angle θ between the upper surface of the object and the reference plane based on the height values. Moreover, in one embodiment, the processor 10 may determine a plurality of outlines indicating the edges of the object 2 based on the one or more illumination images and/or the one or more pattern images, may determine a virtual plane 3 corresponding to the upper surface of the object based on the plurality of outlines, and may determine an angle between the virtual plane 3 and the reference plane as an angle θ at which the object 2 is tilted.

The memory 20 may store various types of data. The data stored in the memory 20 is data acquired, processed or used by at least one component of the apparatus 1, and may include software (e.g., instructions, programs, etc.). The memory 20 may include a volatile memory and/or a non-volatile memory. In the present disclosure, the instructions or programs are software stored in the memory 20, and may include an operating system for controlling the resources of the apparatus 1, an application, and/or middleware that provides various functions to the application so that the application can utilize the resources of the apparatus 1. In one embodiment, the memory 20 may store commands that, when executed by the processor 10, cause the processor 10 to perform an operation.

In one embodiment, the apparatus 1 may further include a transceiver (not shown). The transceiver may perform wireless or wired communication between the apparatus 1 and a server, or between the apparatus 1 and other devices. For example, the transceiver 230 may perform wireless communication according to a method such as eMBB (enhanced Mobile Broadband), URLLC (Ultra Reliable Low-Latency Communication), MMTC (Massive Machine Type Communication), LTE (Long-Term Evolution), LTE-A (LTE Advance), NR (New Radio), UMTS (Universal Mobile Telecommunications System), GSM (Global System for Mobile Communication), CDMA (Code Division Multiple Access), WCDMA (Wideband CDMA), WiBro (Wireless Broadband), WiFi (Wireless Fidelity), Bluetooth, NFC (Near Field Communication), GPS (Global Positioning System), or GNSS (Global Navigation Satellite System). For example, the transceiver may perform wired communication according to a method such as USB (Universal Serial Bus), HDMI (High Definition Multimedia Interface), RS-232 (Recommended Standard-232), or POTS (Plain Old Telephone Service). In one embodiment, the processor 10 may acquire information from the server by controlling the transceiver. The information acquired from the server may be stored in the memory 20. In one embodiment, the information acquired from the server may include parameters or various kinds of information which are necessary to extract outlines from an image, determine relationship information between the extracted outlines, or generate a virtual three-dimensional model 3. In one embodiment, the information acquired from the server may include an intrinsic or extrinsic parameter value of the camera 50 for calibration of the camera 50.

In one embodiment, the apparatus 1 may further include a user interface (not shown). The user interface may receive an input from a user and may output (display) information to the user. In one embodiment, the user interface may include an input device and/or an output device. The input device may be a device that receives information, which is to be transmitted to at least one component of the apparatus 1, from the outside. For example, the input device may include a mouse, a keyboard, a touch pad and the like. The output device may be a device that provides various kinds of information on the apparatus 1 to a user in a visual form. For example, the output device may include a display, a projector, a hologram, and the like. In one embodiment, the user interface may receive parameters that can be used for inspection of the object 2 from the user, or may display the determined tilt angle θ of the object 2 to the user.

In one embodiment, the apparatus 1 may be an apparatus of various types. For example, the apparatus 1 may be a portable communication apparatus, a computer apparatus, a portable multimedia apparatus, or a combination of two or more of the aforementioned apparatuses. However, the apparatus 1 of the present disclosure is not limited to the aforementioned apparatuses.

Various embodiments of the apparatus 1 according to the present disclosure may be combined with each other. The respective embodiments may be combined according to the number of cases, and the embodiments of the apparatus 1 made by such combination also fall within the scope of the present disclosure. In addition, the internal/external components of the apparatus 1 according to the present disclosure described above may be added, modified, replaced or deleted depending on the embodiments. In addition, the internal/external components of the apparatus 1 described above may be implemented as hardware components.

Figure 3:
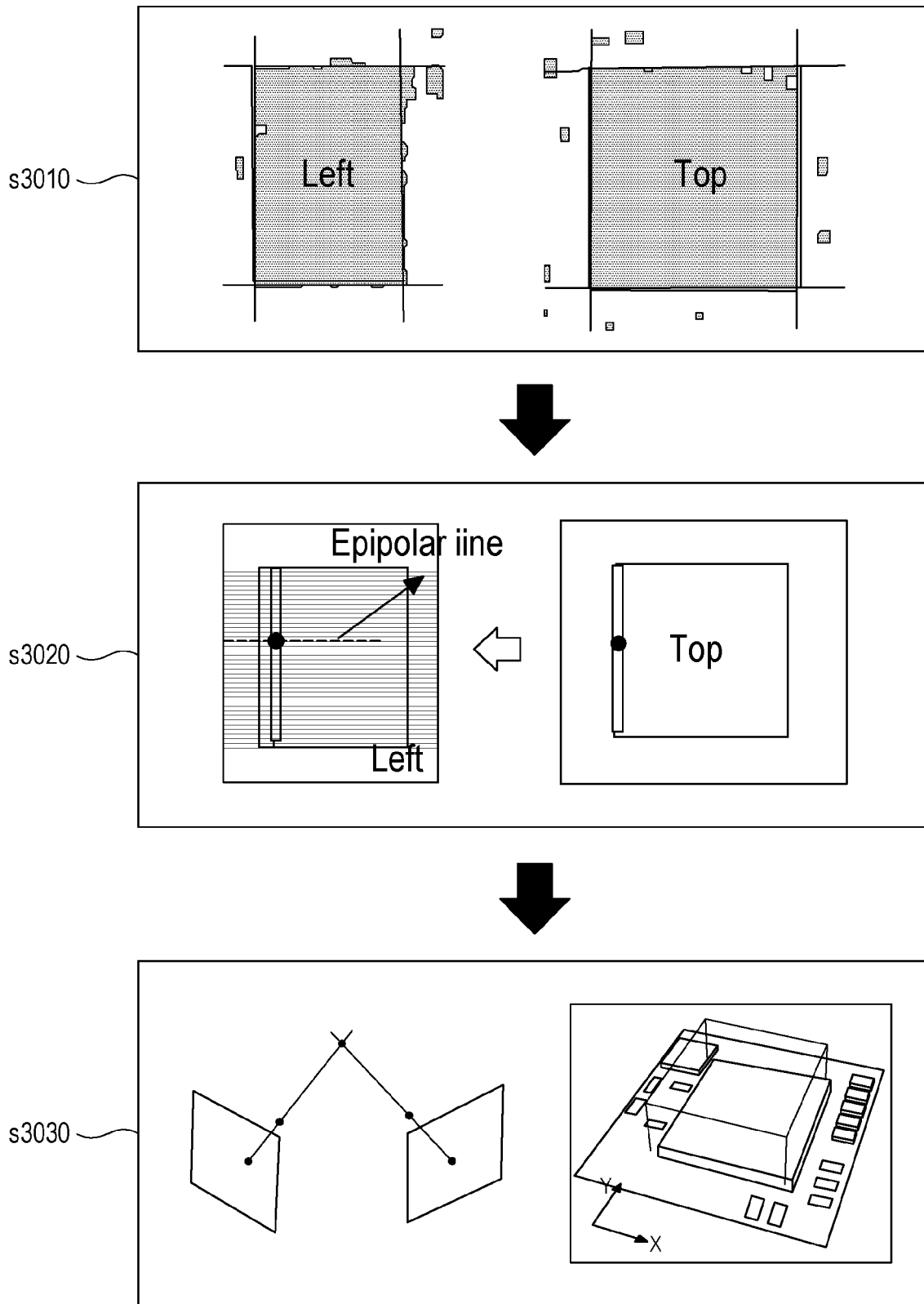
FIG. 3 is a diagram illustrating a process of generating a virtual plane with respect to an upper surface of an object according to an embodiment of the present disclosure.

FIG. 3 is a diagram illustrating a process of generating a virtual plane with respect to an upper surface of an object according to an embodiment of the present disclosure. The process of generating the virtual plane 3 may include a calibration process, an outline extraction process, a determination process of relationship information between the outlines, and/or a generation process of a virtual plane.

In the calibration process (not shown), the apparatus 1 may calibrate the cameras 50. Through the calibration process, the apparatus 1 may acquire basic information necessary to generate a virtual plane for the upper surface of the object. Specifically, in this process, the apparatus 1 may acquire position information (i.e., origin position information) of each of the cameras 50. Here, the origin position of each of the cameras 50 may mean a position of a point in a three-dimensional space when each of the cameras is viewed as a point. In some embodiments, the position of each of the cameras 50 may appear as a position relative to the object 2 or may appear as an absolute position in a three-dimensional space coordinate system. In addition, during the calibration process, the apparatus 1 may acquire view angle information and/or intrinsic parameters of each of the cameras 50. The information acquired during the calibration process may be stored in the memory 20. In one embodiment, the calibration-related information may be acquired from the server through the transceiver. In one embodiment, the calibration process is an optional process and may be omitted.

Hereinafter, the outline extraction process, the determination process of relationship information between the outlines, and the generation process of the virtual plane will be described. These processes may be performed using two arbitrary images selected from the one or more illumination images and the one or more pattern images. However, for the sake of convenience of description, these processes will be described based on one top image and one side (left) image.

In the outline extraction process (s3010), the processor 10 may extract outlines from the top image and the side image. Among the extracted outlines, there may be outlines that indicate the same one edge of the object 2 on different images. For example, the processor 10 may extract an outline (hereinafter referred to as first outline) indicating one edge of the object 2 from the top image, and may extract an outline (hereinafter referred to as second outline) indicating the same corresponding edge from the side image.

In the determination process of relationship information between outlines (s3020), the processor 10 may determine (derive) relationship information (hereinafter referred to as first relationship information) between the first outline and the second outline. Here, the edge of the object 2 indicated by the two outlines may be an edge shared by two adjacent surfaces of the object 2. Specifically, one point (hereinafter referred to as first point) on the first outline and one point (hereinafter referred to as second point) on the second outline may commonly represent one point (hereinafter referred to as target point) on the actual edge of the object and, therefore, may correspond to each other. When looking at the target point from the top camera, the target point may be represented as the first point on the top image. Assuming that a straight line connecting the origin of the top camera to the target point exists in a three-dimensional space, if the straight line is viewed from one side camera, the straight line may appear as a two-dimensional straight line on the corresponding side image. This two-dimensional straight line is called an epipolar line for the first point. An intersection point between the epipolar line for the first point and the second outline may be derived from the corresponding side image. This intersection point may be the aforementioned second point (i.e., a point corresponding to the first point). The transformation from the first point to the epipolar line for the first point may be defined by a fundamental matrix, which is a concept according to the epipolar geometry. The fundamental matrix may be derived from the camera calibration information described above.

In one embodiment, the first relationship information may include information on two corresponding points (the first point and the second point). In one embodiment, the first relationship information may be a pair of two-dimensional pixel coordinates of these two points (the first point and the second point), a pair of three-dimensional space coordinates of these two points, or a transformation relation or transformation matrix between the two-dimensional pixel coordinates or between the three-dimensional space coordinates.

In the generation process of the virtual plane (s3030), the processor 10 may determine (generate) a virtual plane 3 corresponding to the upper surface of the object by using the determined first relationship information. Specifically, the processor 10 may acquire a vector from the origin of the top camera to the coordinates of the first point and a vector from the origin of the side camera to the coordinates of the second point using the first relationship information, and may derive a point where the two vectors meet. Using the points derived in this manner, three-dimensional modeling may be performed on the entire upper surface of the object.

The generation process of the virtual plane 3 has been described above based on the top image and one side (left) image. Alternatively, as described above, the virtual plane 3 may be generated by using two different side images among the plurality of side images. In this case, the processor 10 may extract an outline (hereinafter referred to as third outline) indicating one edge of the object 2 from one of the side images, and may extract an outline (hereinafter referred to as fourth outline) indicating the same corresponding edge from another side image. The processor 10 may further acquire relationship information (hereinafter referred to as second relationship information) indicating a correspondence relationship between the third and fourth outlines. The processor 10 may determine the virtual plane 3 based on the first relationship information and/or the second relationship information.

In an embodiment, the determination process (acquiring process) of relationship information from the images by the processor 10 (s3020) may be repeated a plurality of times. The determination process of the relationship information may be repeated a plurality of times according to combinations of a top image and side images. In one embodiment, the processor 10 may perform the determination process of relationship information a plurality of times, by changing the images used to determine (acquire) relationship information on the same surface depending on the types (top, front, rear, left, right, etc.) of the illumination images or the pattern images. In one embodiment, the processor 10 may perform the determination process of relationship information on the same surface a plurality of times, depending on the irradiation angles and directions of the illumination light sources or the pattern light sources.

Figure 4:
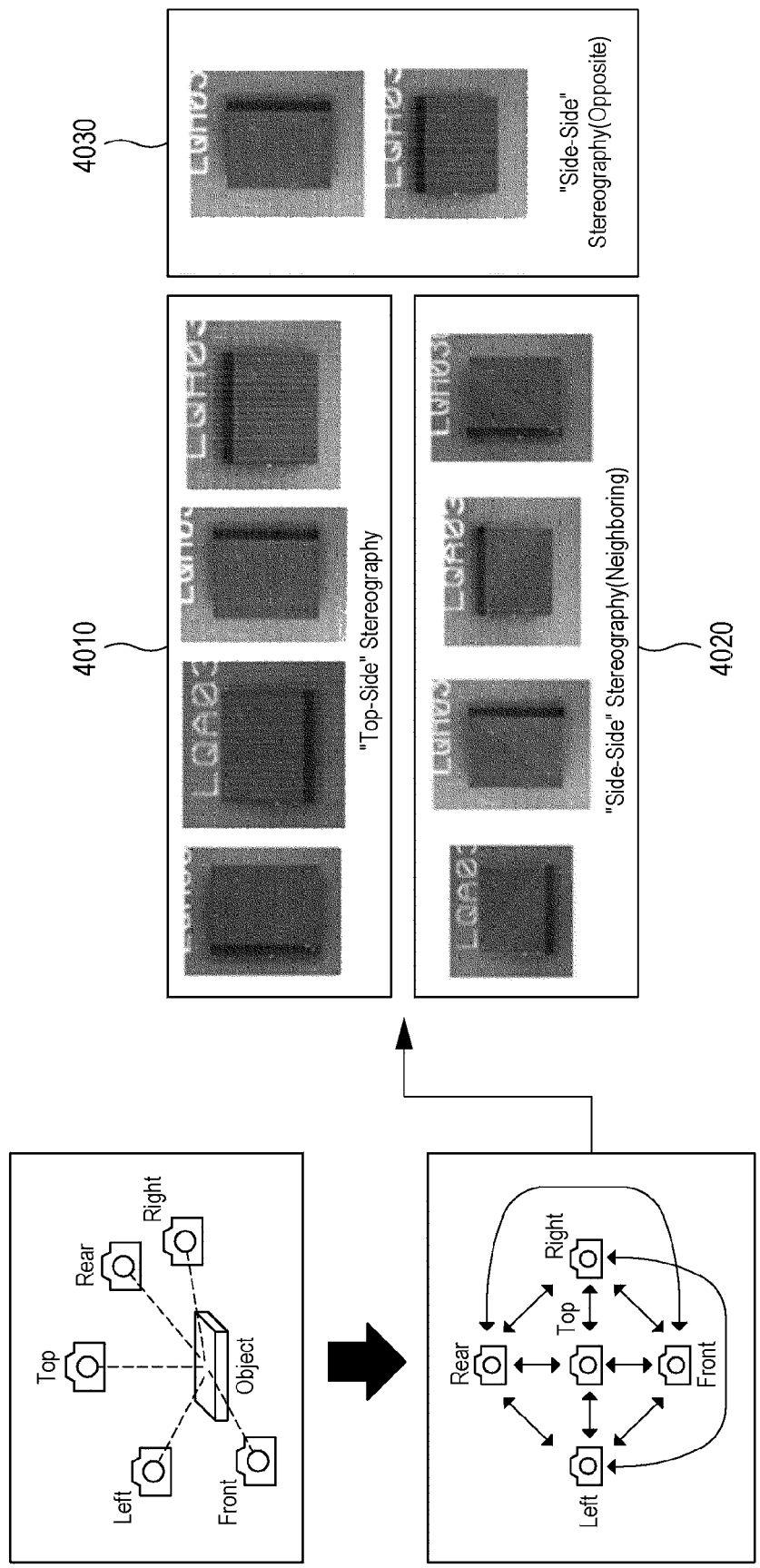
FIG. 4 is a diagram explaining acquisition of various images and a combination of the images for determining relationship information according to an embodiment of the present disclosure.

FIG. 4 is a diagram explaining acquisition of various images and combination of the images for determining relationship information according to an embodiment of the present disclosure. The apparatus 1 may acquire a plurality of images from an object. The acquired images may vary depending on the type of the light used, the irradiation direction of the light used, the irradiation angle of the light used, and the like.

In one embodiment, the apparatus 1 may acquire a plurality of illumination images or pattern images in one direction of the object, depending on whether the light used for image capture is illumination light or pattern light. That is, for the same surface of the object, a plurality of images may be acquired according to the type of the light used.

In one embodiment, the apparatus 1 may acquire a plurality of images in one direction of the object depending on the direction or angle in which the pattern light source 30 or the illumination light source 40 irradiates light onto the object. For example, one or more pattern light sources 30 may be disposed at various positions (e.g., 8-way positions) to irradiate pattern light toward the object. The arrangement of the pattern light sources 30 will be described later. Depending on the direction of the irradiated pattern light, a plurality of pattern images may be acquired for the same surface of the object. In addition, for example, one or more illumination light sources 40 may irradiate illumination light toward the object at various angles. The arrangement of the illumination light sources 40 will be described later.

Depending on the angle of the irradiated illumination light, a plurality of illumination images may be acquired for the same surface of the object.

In one embodiment, the apparatus 1 may select images for different directions (the top image, the side image in each direction, etc.) from the illumination images or the pattern images acquired for the respective directions of the object as described above, and may determine relationship information between the outlines from the two images. First, the processor 10 may select the top image and one side image, and may determine first relationship information from the selected images. The top image may represent the upper surface of the object, and the one side image may represent the upper surface and one or more side surfaces of the object. Since the upper and side surfaces of the object share edges, the first relationship information may be determined from the top image and the side image. For example, when the object has a rectangular parallelepiped shape, four pieces of first relationship information may be determined.

Secondly, the processor 10 may select side images of two different directions among the one or more side images, and may determine second relationship information from the selected images. The two side images may represent two adjacent side surfaces of the object. Since the two adjacent side surfaces share an edge of the object, the second relationship information may be determined from the two side images. For example, when the object has a rectangular parallelepiped shape, four pieces of second relationship information may be determined.

Thirdly, the processor 10 may select two side images representing two side surfaces of the object, which do not share an edge, among the one or more side images, and may determine relationship information (hereinafter referred to as third relationship information) from the selected images. Also in this case, third relationship information may be determined using an epipolar line. Specifically, when the object has a rectangular parallelepiped shape, two parallel side surfaces may have two parallel edges. A point on one outline on one side image may appear as a straight line (epipolar line) on the other parallel side image. A point at which the epipolar line intersects an outline in the other side image may correspond to the point in the original side image. Third relationship information indicating this correspondence relationship may be determined. For example, when the object has a rectangular parallelepiped shape, two pieces of third relationship information may be determined.

The processor 10 may determine a virtual plane 3 for the upper surface of the object by using at least one of the above-described first relationship information, second relationship information and/or third relationship information. Various pieces of relationship information can be acquired according to the combination of two images from which the relationship information is determined, the irradiation direction or angle, the type of illumination, and the like. The processor 10 can more accurately generate a virtual plane by utilizing the various pieces of relationship information.

FIG. 5 is a diagram illustrating a form in which one or more pattern light sources 30 according to an embodiment of the present disclosure are arranged. As described above, the apparatus 1 may include one or more pattern light sources 30. The pattern light sources 30 may be disposed at various positions around the object 2 to irradiate pattern light toward the object 2.

In the illustrated embodiment 5010, the pattern light source 30 may be one light source positioned on a normal line 4 of the upper surface of the object 2 and configured to irradiate pattern light toward the object 2. Specifically, the normal line 4 perpendicular to the upper surface of the object 2 may be drawn. The one pattern light source 30 may be positioned at a point on the normal line 4. The pattern light source 30 may irradiate pattern light toward the upper surface of the object 2. In one embodiment, the normal line 4 may be drawn as a half line extending from the center of the upper surface of the object 2 toward the opposite side of the reference plane. In some embodiments, the distance between the one pattern light source 30 and the object 2 may be changed. In one embodiment, the one pattern light source 30 may sequentially irradiate the pattern light toward the object 2 several times while changing the phase of the pattern of the pattern light.

In the illustrated embodiment 5020, the pattern light sources 30 may be a plurality of pattern light sources 30 arranged on a concentric circle 5 above the upper surface of the object. Specifically, it may be possible to assume a concentric circle 5, which has a center on the normal line 4 of the upper surface of the object and is parallel to the reference plane. A plurality of pattern light sources 30 may be disposed on the circumference of the concentric circle 5. The pattern light sources 30 may irradiate pattern light toward the object 2. In some embodiments, the radius of the concentric circle 5 may be changed. In some embodiments, the spacing between the pattern light sources 30 arranged on the concentric circle 5 may be changed. In one embodiment, the pattern light sources 30 may be disposed on the circumference of the concentric circles 5 at equal intervals, or may be disposed on the circumference of the concentric circles 5 at different intervals which are arbitrarily set. In one embodiment, eight pattern light sources 30 may be arranged at intervals of 45 degrees. The arrangement of the plurality of pattern light sources 30 in this case may be referred to as an 8-way arrangement. In one embodiment, the pattern light sources 30 may sequentially irradiate pattern light toward the object 2. In one embodiment, the patterns of the pattern light irradiated by the pattern light sources 30 may have different phases.

Figure 6:
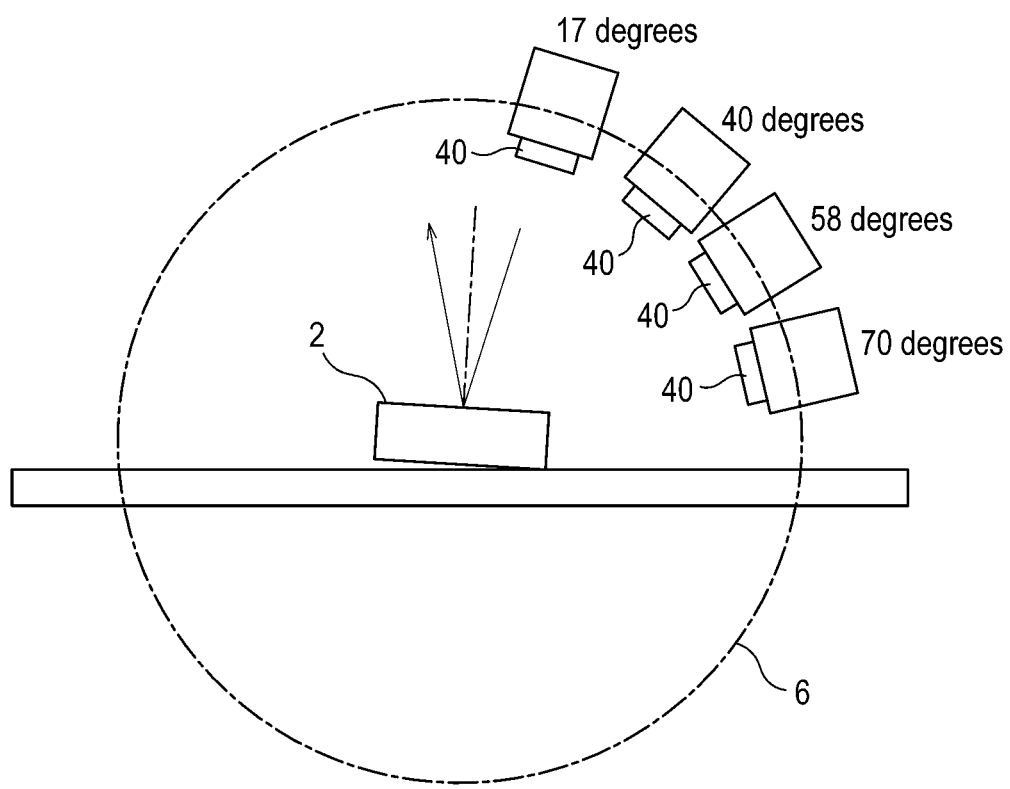
FIG. 6 is a diagram illustrating a form in which one or more illumination light sources according to an embodiment of the present disclosure are arranged.

FIG. 6 is a diagram illustrating a form in which one or more illumination light sources according to an embodiment of the present disclosure are arranged. As described above, the apparatus 1 may include the one or more illumination light sources 40. The illumination light sources 40 may be disposed at various positions around the object to irradiate illumination light toward the object.

In the illustrated embodiment, the illumination light sources 40 may be a plurality of illumination light sources 40 arranged on a concentric circle 6 perpendicular to the reference plane. Specifically, it may be possible to assume a concentric circle 6, which has a center at the object and is perpendicular to the reference plane. The illumination light sources 40 may be disposed on the circumference of the concentric circle 6. The illumination light sources 40 may irradiate illumination light toward the object.

In some embodiments, the radius of the concentric circle 6 may be changed. In some embodiments, the spacing of the illumination light sources 40 arranged on the concentric circle 6 may be changed. In one embodiment, the illumination light sources 40 may be arranged on the circumference of the concentric circle 6 at equal intervals, or may be arranged on the circumference of the concentric circle 6 at different intervals which are arbitrarily set. In one embodiment, each of the illumination light sources 40 may be arranged at an arbitrary angle. Here, the angle may mean an angle of the position of each of the illumination light sources 40 on the circumference of the concentric circle 6 with respect to the normal line of the reference plane. In one embodiment, at least one of the illumination light sources 40 may be disposed at a large angle of 70 degrees or more (a small angle with respect to the reference plane). In one embodiment, the illumination light sources 40 may be arranged at angles of 17 degrees, 40 degrees, 58 degrees and 70 degrees, respectively. In one embodiment, the illumination light sources 40 may be arranged only above the reference plane. In one embodiment, the illumination light sources 40 may sequentially irradiate illumination light toward the object 2. In one embodiment, the illumination light irradiated by the illumination light sources 40 may have different wavelengths. In one embodiment, each of the illumination light sources 40 may include a red light source, a green light source and a blue light source which are capable of irradiating red light, green light and blue light, respectively. In one embodiment, the illumination light sources 40 may first irradiate light of one wavelength (e.g., red light) to the object sequentially for each arrangement angle. Thereafter, the illumination light sources 40 may irradiate light of another wavelength (e.g., green light) to the object sequentially for each arrangement angle. Then, the illumination light sources 40 may irradiate light of the remaining wavelength (e.g., blue light) to the object sequentially for each arrangement angle. In one embodiment, the illumination light sources 40 may sequentially irradiate red light, green light and blue light for one angle, and then may sequentially irradiate red light, green light and blue light for the next angle. In one embodiment, when the red light, the green light and the blue light are individually irradiated, the order of irradiation may be changed according to the intention of a designer. In one embodiment, when irradiating two-dimensional illumination light, the respective illumination light sources 40 may simultaneously irradiate red light, green light and blue light to irradiate mixed white light to the object. In one embodiment, each of the illumination light sources 40 may irradiate ordinary white light rather than the mixed white light to the object. In one embodiment, the illumination light sources 40 arranged at different angles may simultaneously irradiate mixed white light to saturate the surface of the object. In this case, the reflected illumination light may be captured to acquire an illumination image of the surface of the object.

Figure 7:
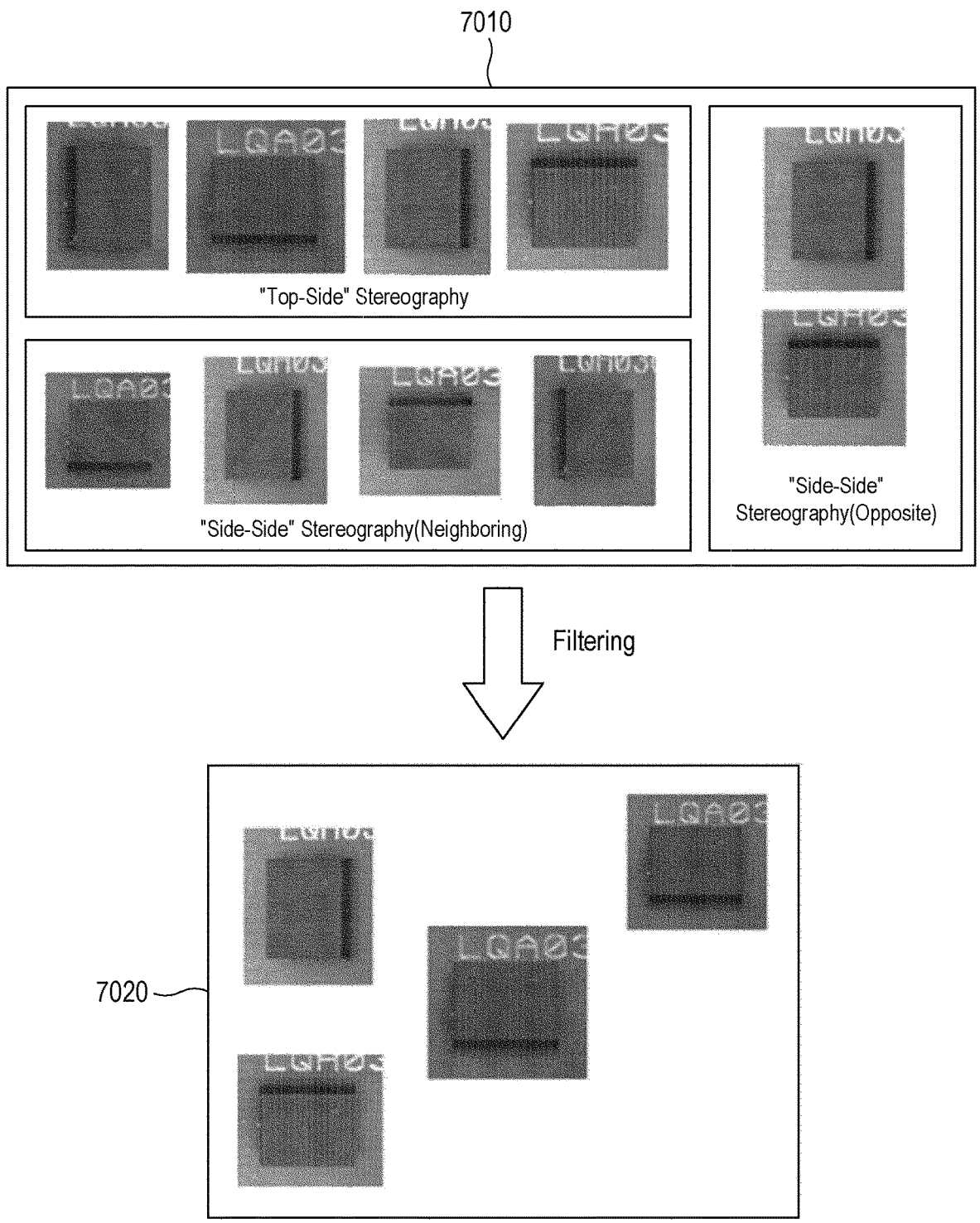
FIG. 7 is a diagram illustrating an image filtering process according to an embodiment of the present disclosure.

FIG. 7 is a diagram illustrating an image filtering process according to an embodiment of the present disclosure. In one embodiment, the processor 10 may filter the images acquired according to various factors (the type of light, the irradiation direction, the angle, etc.) based on predetermined criteria, and then may generate a virtual plane 3 by using only the image selected from the image filtering process. When the apparatus 1 inspects an object (e.g., a die) on a substrate, the inspection may be affected by other elements and irregularities on the substrate. Due to this effect, distortion may occur in the acquired images, or distortion may occur in the outlines acquired from the images. When the virtual plane 3 is generated based on a distorted image or a distorted outline, it may be difficult to accurately measure or inspect the object 2. In order to prevent this, only the image filtered based on the predetermined criteria may be selected and used to generate the virtual plane 3.

In one embodiment, the processor 10 may perform the image filtering process based on whether or not a contrast value of the surface of the object 2 appearing on the image is equal to or greater than a predetermined value. The processor 10 may discard the images having a contrast value less than the predetermined value, may select only the images having contrast values equal to or greater than the predetermined value, and may determine (derive) the aforementioned relationship information therefrom.

In one embodiment, the processor 10 may perform the image filtering process based on whether or not the outlines appearing on the images have continuity. The processor 10 may select only the images in which the outline indicating one edge of the object appears as a line segment having continuity, and may determine the aforementioned relationship information therefrom. Further, in one embodiment, the processor 10 may statistically calculate an average or median value of the outline position coordinates extracted from a plurality of images, and may exclude the image from which an outline having position coordinates deviating from the average or median value by a predetermined ratio or more is extracted. In this case, the processor 10 may determine the aforementioned relationship information based on only the images that are not excluded.

Figure 8:
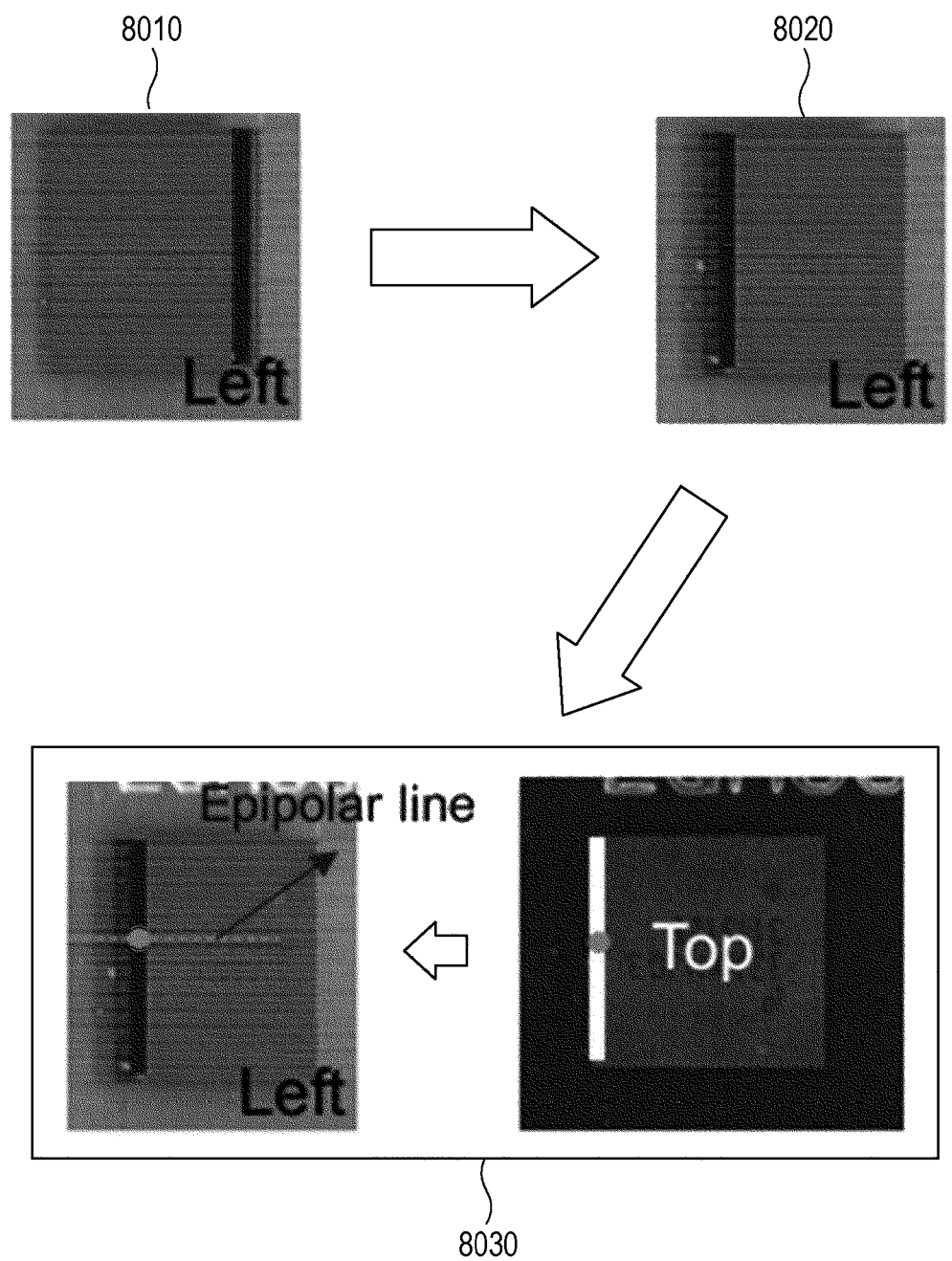
FIG. 8 is a diagram illustrating a process of deriving another outline from one outline of an image according to an embodiment of the present disclosure.

FIG. 8 is a diagram illustrating a process of deriving another outline from one outline of an image according to an embodiment of the present disclosure. In one embodiment, the processor 10 may determine another outline from one outline using the pre-stored specification information on the object 2. As described above, when the apparatus 1 inspects the object on the substrate, the inspection may be affected by other elements and irregularities of the substrate. Accordingly, it may not be possible to extract the outline required for determining the relationship information. In this case, in order to supplement the outline extraction process, another outline may be derived from one outline by using the pre-stored specification information on the object 2.

Specifically, the memory 20 may include the specification information on the object 2. The specification information may include width, length and height information on the object 2. After extracting the outline from the image, the processor 10 may predict and derive a position of an outline parallel to the corresponding outline by using the specification information. For example, it may be assumed that an outline 8010 of the lower surface of the object 2 has been extracted and an outline of the upper surface of the object 2 parallel to the outline of the lower surface has not been extracted due to a predetermined distortion. In this case, the processor 10 may acquire height information on the object 2 based on the specification information, and may apply the height information to the extracted outline of the lower surface to predict the position of the outline of the upper surface parallel to the outline of the lower surface. In this way, it is possible to extract an outline of the upper surface 8020.

In the case where the distortion on the image or the outline makes it impossible to extract the outline required for determining the relationship information to be determined, the processor 10 may first extract an outline parallel to the required outline, and then may acquire the required outline by applying the specification information as described above. The processor 10 may determine relationship information by using the outline required for determining the relationship information 8030.

In one embodiment, even when the object 2 does not have a rectangular parallelepiped shape, the specification information may include information on the shape of the object. For example, when the object has a cylindrical shape, the specification information may store information on the radius and height of a cylinder. The processor 10 may derive another outline required for determining relationship information from one outline by using the radius and height information.

In one embodiment, the memory 20 may serve as a database for storing specification information of objects to be inspected. The memory 20 may store specification information on objects (e.g., devices, chips, etc.) positioned on a substrate or used in general. In one embodiment, the processor 10 may identify an object from the acquired images, and then may read specification information corresponding to the identified object from the memory 20. The processor 10 may derive another outline required for determining relationship information from one outline of the identified object based on the acquired specification information. In one embodiment, the processor 10 may acquire specification information of objects from a server by controlling a transceiver. The acquired specification information may be stored in the memory 20.

FIG. 9 is a diagram showing an example of a method for inspection, which may be performed by the apparatus 1 according to the present disclosure. The method for inspection according to the present disclosure may be a computer-implemented method. Although the respective steps of the method or algorithm according to the present disclosure have been described in a sequential order in the illustrated flowchart, the respective steps may be performed in an order that can be arbitrarily combined by the present disclosure, in addition to being performed sequentially. The description in accordance with this flowchart does not exclude making changes or modifications to the method or algorithm, and does not imply that any step is necessary or desirable. In one embodiment, at least some of the steps may be performed in parallel, repetitively or heuristically. In one embodiment, at least some of the steps may be omitted, or other steps may be added.

The apparatus 1 according to the present disclosure may perform a method for inspection according to various embodiments of the present disclosure. A method according to an embodiment of the present disclosure may include irradiating illumination light to an object on a reference plane (S910), capturing one or more illumination images generated by illumination light reflected from the object (S920), determining a plurality of outlines indicating edges of the object on the one or more illumination images (S930), determining height values of an edge of an upper surface of the object with respect to the reference plane based on the plurality of outlines (S940), and/or determining a first angle between the upper surface of the object and the reference plane based on the height values (S950).

In step S910, at least one first light source (e.g., the illumination light source 40) of the apparatus 1 may irradiate illumination light to the object 2 on the reference plane. In step S920, the one or more cameras 50 of the apparatus 1 may capture one or more illumination images generated by the illumination light reflected from the object 2.

In step S930, the one or more processors 10 of the apparatus 1 may determine a plurality of outlines indicating the edges of the object 2 on the one or more illumination images. In step S940, the processors 10 may determine height values of the edge of the upper surface of the object with respect to the reference plane based on the plurality of outlines. In step S950, the processors 10 may determine a first angle (e.g., an angle θ) between the upper surface of the object and the reference plane based on the height values.

In one embodiment, the method according to the present disclosure may further include irradiating, by at least one second light source (e.g., the pattern light source 30) of the apparatus 1, pattern light to the object 2, capturing, by the one or more cameras 50, one or more pattern images generated by the pattern light reflected from the object 2, determining, by the processor 10, a plurality of outlines indicating the edges of the object 2 based on the one or more illumination images and the one or more pattern images, determining, by the processor 10, a virtual plane 3 corresponding to the upper surface of the object 2 based on the plurality of outlines, and/or determining, by the processor 10, a second angle between the virtual plane 3 and the reference plane as the first angle.

In one embodiment, determining the virtual plane may include extracting a first outline from a top image and a second outline from one or more side images. The first outline and the second outline may indicate the same one edge of the object 2. Determining the virtual plane may further include determining the virtual plane 3 based on the first outline and the second outline.

In one embodiment, determining the virtual plane may further include determining first relationship information indicating a correspondence relationship between the first outline and the second outline, and/or determining the virtual plane 3 based on the first relationship information.

In an embodiment, determining the virtual plane may further include extracting a third outline from one side image and a fourth outline from another side image. The third outline and the fourth outline may indicate the same one edge of the object among the one or more side images. Determining the virtual plane may further include determining second relationship information indicating a correspondence relationship between the third outline and the fourth outline, and/or determining the virtual plane 3 based on the first relationship information and the second relationship information.

In one embodiment, determining the virtual plane may further include selecting images in which contrast values of a surface of the object are equal to or greater than a predetermined value, among the one or more illumination images and the one or more pattern images to determine the virtual plane 3.

Various embodiments of the present disclosure may be implemented as software recorded on a machine-readable recording medium. The software may be software for implementing the various embodiments of the present disclosure described above. The software may be inferred from various embodiments of the present disclosure by programmers in the art to which the present disclosure belongs. For example, the software may be commands (e.g., code or code segments) or programs that can be read by a device. The device is a device capable of operating according to commands called from a recording medium, and may be, for example, a computer. In one embodiment, the device may be the electronic apparatus 1 according to embodiments of the present disclosure. In one embodiment, the processor of the device may execute the called commands so that the components of the device can perform a function corresponding to the commands. In one embodiment, the processor may be one or more processors 10 according to the embodiments of the present disclosure. The recording medium may refer to any type of device-readable recording medium in which data is stored. The recording medium may include, for example, a ROM, a RAM, a CD-ROM, a magnetic tape, a floppy disk, an optical data storage device, and the like. In one embodiment, the recording medium may be one or more memories 20. In one embodiment, the recording medium may be implemented in such a form that it is distributed in computer systems connected by a network. The software may be distributed, stored and executed in a computer system or the like. The recording medium may be a non-transitory recording medium. The non-transitory recording medium refers to a tangible medium irrespective of whether data is stored semi-permanently or temporarily, and does not include a signal propagating in a transitory manner.

Although the technical contents of the present disclosure have been described by the examples described in some embodiments and illustrated in the accompanying drawings, it should be noted that various substitutions, modifications, and changes can be made without departing from the scope of the present disclosure which can be understood by those skilled in the art to which the present disclosure pertains. In addition, it should be noted that such substitutions, modifications and changes are intended to fall within the scope of the appended claims.

What is claimed is:

1. An apparatus for inspecting an object, comprising:
   at least one light source configured to irradiate illumination light to the object on a reference plane;
   a plurality of side cameras configured to capture a plurality of side images generated by the illumination light reflected from a side of the object; and
   one or more processors configured to:
      determine a plurality of outlines indicating edges of the object based on two or more side images captured in different directions among the plurality of side images;
      determine a virtual plane corresponding to an upper surface of the object based on the plurality of outlines; and
      determine an angle between the virtual plane and the reference plane.

2. The apparatus of claim 1, further comprising a top camera configured to capture a top image generated by the illumination light reflected from above the object.

3. The apparatus of claim 2, wherein the one or more processors are further configured to:
   extract a first outline from the top image and a second outline from the plurality of side images, the first outline and the second outline indicating the same one edge of the object; and
   determine the virtual plane based on the first outline and the second outline.

4. The apparatus of claim 3, wherein the one or more processors are further configured to:
   determine first relationship information indicating a correspondence relationship between the first outline and the second outline; and
   determine the virtual plane based on the first relationship information.

5. The apparatus of claim 4, wherein a first point on the first outline corresponds to a second point on the second outline, and
   wherein the first relationship information includes a pair of coordinate information of the first point on the top image and coordinate information of the second point on the plurality of side images.

6. The apparatus of claim 1, wherein the one or more processors are further configured to:
   extract a third outline from one side image among the two or more side images;
   extract a fourth outline from another side image among the two or more side images, the third outline and the fourth outline indicating the same one edge of the object;
   determine second relationship information indicating a correspondence relationship between the third outline and the fourth outline; and
   determine the virtual plane based on the second relationship information.

7. The apparatus of claim 1, wherein contrast values of a surface of the object in the two or more side images captured in the different directions are equal to or greater than a predetermined value.

8. The apparatus of claim 1, wherein the at least one light source includes a plurality of light sources disposed on a circumference of a concentric circle perpendicular to the reference plane.

9. An apparatus for inspecting an object, comprising:
   at least one light source configured to irradiate pattern light to the object on a reference plane;
   a plurality of side cameras configured to capture a plurality of side images generated by the pattern light reflected from a side of the object; and
   one or more processors configured to:
      determine a plurality of outlines indicating edges of the object based on two or more side images captured in different directions among the plurality of side images;
      determine a virtual plane corresponding to an upper surface of the object based on the plurality of outlines; and
      determine an angle between the virtual plane and the reference plane.

10. The apparatus of claim 9, wherein the at least one light source includes a light source disposed on a normal line of the upper surface of the object.

11. The apparatus of claim 9, wherein the at least one light source includes a plurality of light sources disposed on a circumference of a concentric circle, and
   wherein the concentric circle has a center at a point on a normal line of the upper surface of the object and is parallel to the reference plane.

12. The apparatus of claim 9, further comprising a top camera configured to capture a top image generated by the pattern light reflected from above the object.

13. The apparatus of claim 12, wherein the one or more processors are further configured to:
   extract a first outline from the top image and a second outline from the plurality of side images, the first outline and the second outline indicating the same one edge of the object; and
   determine the virtual plane based on the first outline and the second outline.

14. The apparatus of claim 13, wherein the one or more processors are further configured to:
   determine first relationship information indicating a correspondence relationship between the first outline and the second outline; and
   determine the virtual plane based on the first relationship information.

15. The apparatus of claim 14, wherein a first point on the first outline corresponds to a second point on the second outline, and
   wherein the first relationship information includes a pair of coordinate information of the first point on the top image and coordinate information of the second point on the plurality of side images.

16. The apparatus of claim 9, wherein the one or more processors are further configured to:
   extract a third outline from one side image among the two or more side images;

extract a fourth outline from another side image among the two or more side images, the third outline and the fourth outline indicating the same one edge of the object;

determine second relationship information indicating a correspondence relationship between the third outline and the fourth outline; and determine the virtual plane based on the second relationship information.

17. The apparatus of claim 9, wherein contrast values of a surface of the object in the two or more side images captured in the different directions are equal to or greater than a predetermined value.

\* \* \* \* \*